(12) United States Patent
Iwamoto

(10) Patent No.: US 8,044,470 B2
(45) Date of Patent: Oct. 25, 2011

(54) SEMICONDUCTOR DEVICE AND METHOD OF FABRICATING THE SAME

(75) Inventor: Toshiyuki Iwamoto, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 105 days.

(21) Appl. No.: 12/385,960

(22) Filed: Apr. 24, 2009

(65) Prior Publication Data

US 2009/0289285 A1    Nov. 26, 2009

(30) Foreign Application Priority Data

May 23, 2008  (JP) ................................ 2008-135836

(51) Int. Cl.
*H01L 21/02*   (2006.01)
(52) U.S. Cl. ................. 257/384; 257/386; 257/E21.634
(58) Field of Classification Search .......................... None
See application file for complete search history.

(56) References Cited

U.S. PATENT DOCUMENTS

| | | | |
|---|---|---|---|
| 6,987,050 B2 | 1/2006 | Cabral, Jr. et al. | |
| 2003/0094662 A1* | 5/2003 | Bae et al. | 257/408 |
| 2005/0101076 A1 | 5/2005 | Nakabayashi | |
| 2006/0038229 A1* | 2/2006 | Tsuchiya et al. | 257/351 |
| 2006/0292799 A1 | 12/2006 | Nakabayashi | |
| 2007/0052039 A1 | 3/2007 | Iinuma et al. | |
| 2007/0215956 A1* | 9/2007 | Tsuchiya et al. | 257/407 |
| 2007/0224808 A1 | 9/2007 | Chang et al. | |
| 2010/0193876 A1* | 8/2010 | Ramani et al. | 257/377 |

FOREIGN PATENT DOCUMENTS

| | | |
|---|---|---|
| JP | 2005-142422 | 6/2005 |
| JP | 2007-67225 | 3/2007 |

OTHER PUBLICATIONS

German Office Action dated Jan. 14, 2011 (with English translation).
J. Demeulemeester, et al., "The influence of Pt redistribution on Ni1-xPtxSi growth properties", 2010 Journal of Applied Physics, v. 108, pp. 043505-1-11, Aug. 2010.
Jer-shen Maa, et al., "Effect of Interlayer on thermal stability of nickel silicide", 2001 American Vacuum Society, J. Vac. Sci. Technol. A 19(4), Jul. Aug. 2001, pp. 1595-1599.

* cited by examiner

*Primary Examiner* — Ha Tran T Nguyen
*Assistant Examiner* — Shaka Scarlett
(74) *Attorney, Agent, or Firm* — McGinn IP Law Group PLLC

(57) ABSTRACT

Provided is a semiconductor device including a transistor that has a silicide layer formed over a semiconductor substrate. The gate electrode of each transistor is composed of a polysilicon electrode and the silicide layer formed thereon. Each transistor further has source/drain impurity-diffused layers composed of low-concentration doped regions and high-concentration doped regions, and silicide layers formed over the source/drain impurity-diffused layers. The surface of each silicide layer is positioned above the surface of the semiconductor substrate. The silicide layers contain a silicidation-suppressive metal, and have a concentration profile of the silicidation-suppressive metal over a region of the silicide layers ranging from the surface to a predetermined depth, such as increasing the concentration from the surface of each silicide layer in the depth-wise direction of the semiconductor substrate.

7 Claims, 10 Drawing Sheets

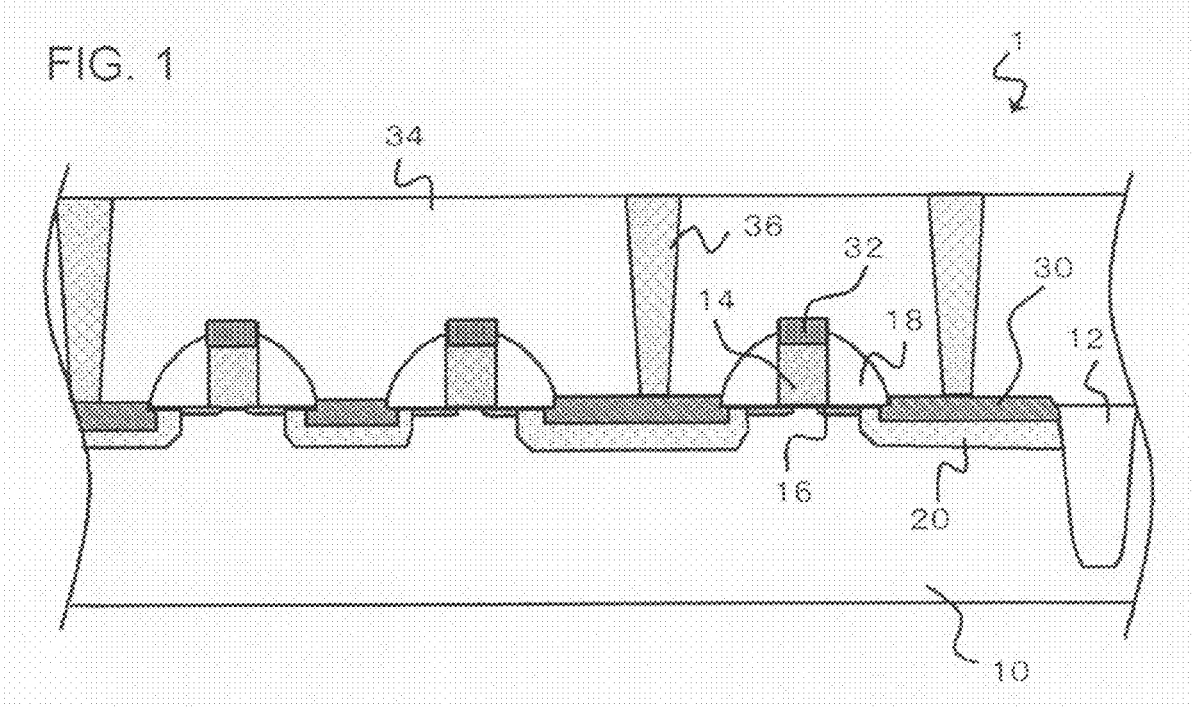

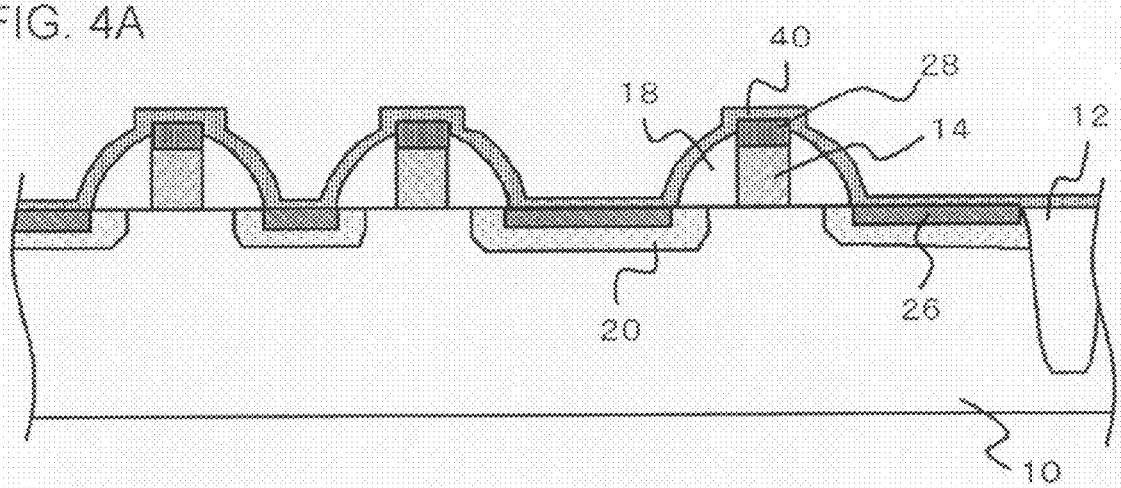
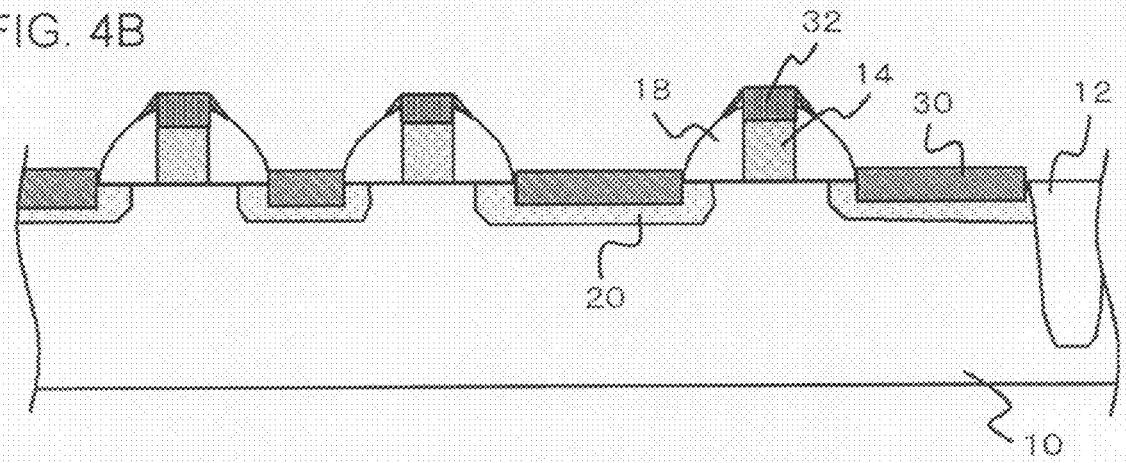

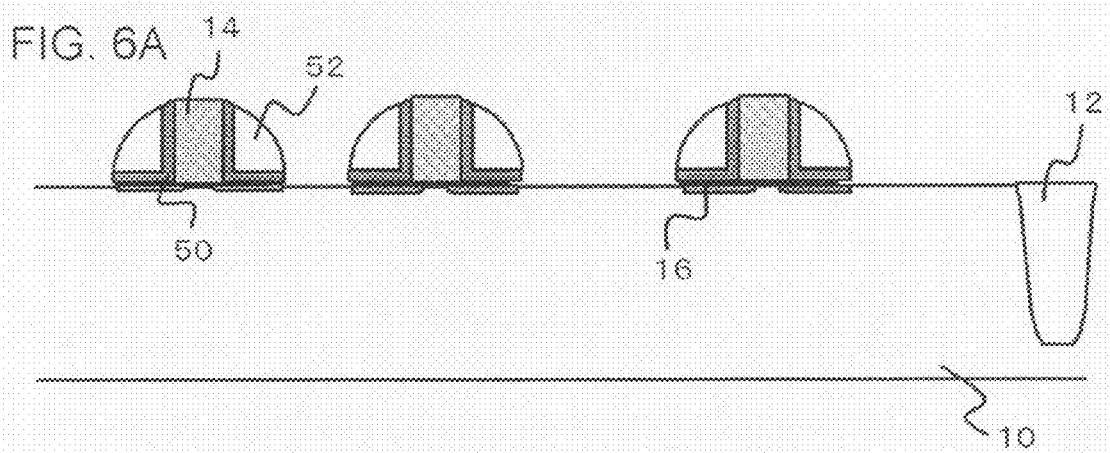
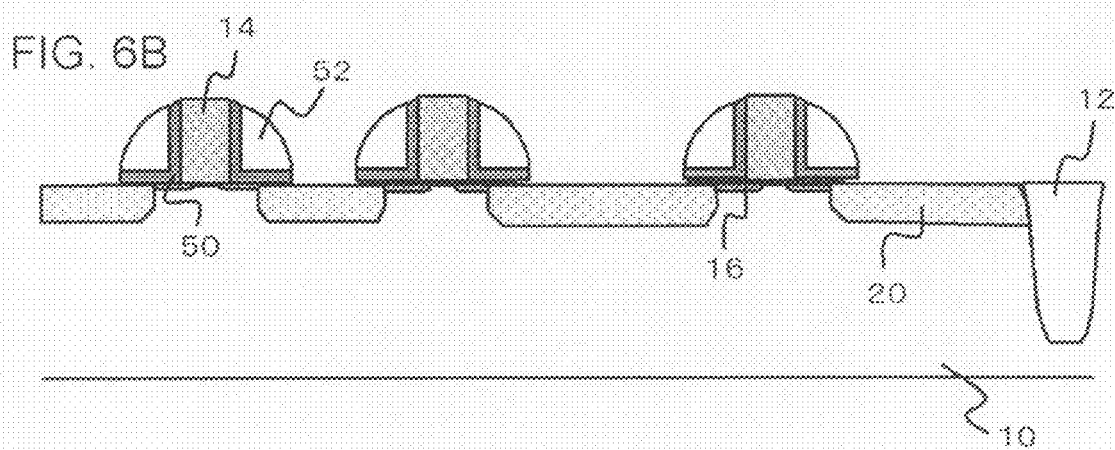
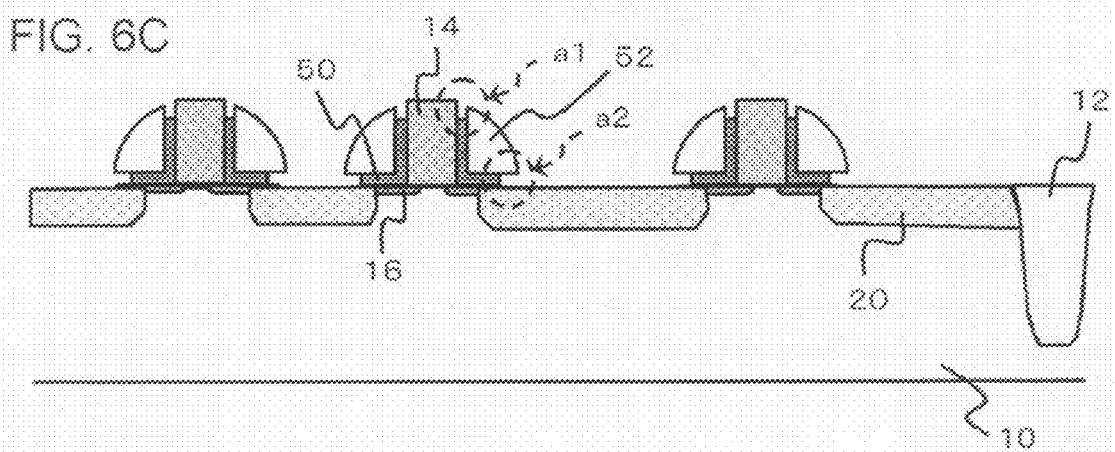

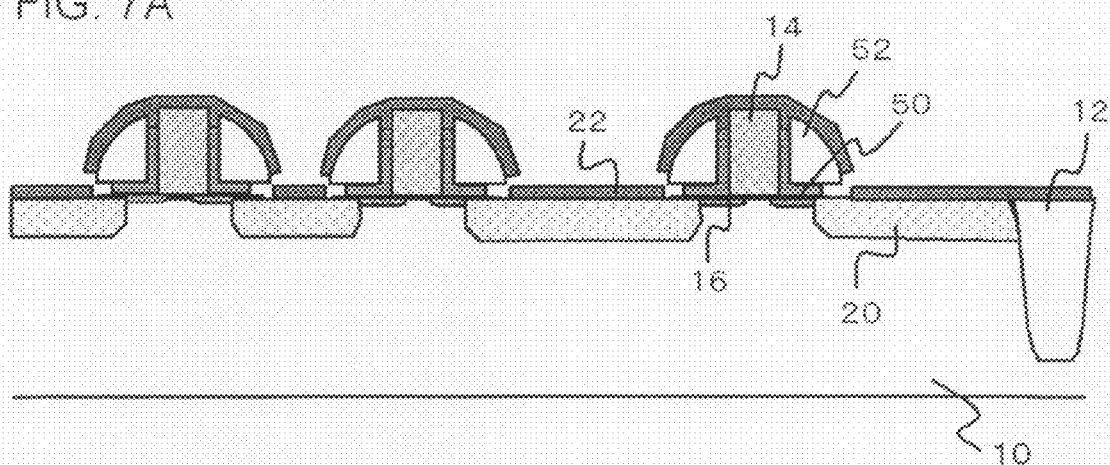
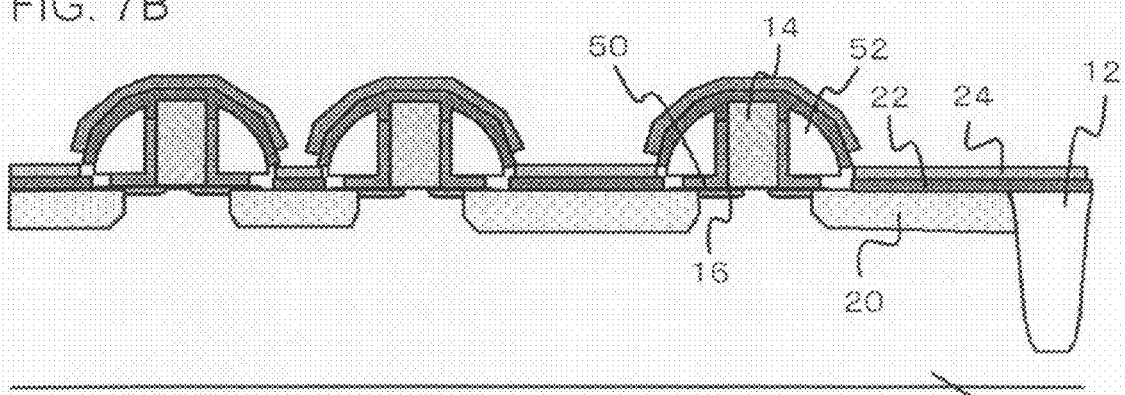
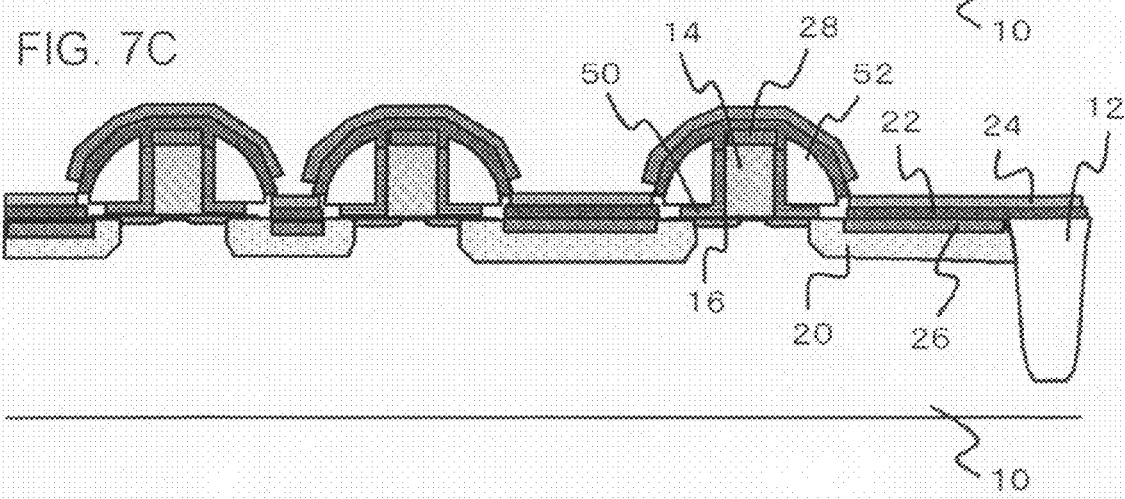

SEMICONDUCTOR DEVICE AND METHOD OF FABRICATING THE SAME

This application is based on Japanese patent application No. 2008-135836 the content of which is incorporated hereinto by reference.

BACKGROUND

1. Technical Field

The present invention relates to a semiconductor device and a method of manufacturing the same, and in particular to a semiconductor device having a silicide layer and a method of manufacturing the same.

2. Related Art

In semiconductor elements, such as MOS transistors, composing semiconductor integrated circuits silicide layers are formed over the source/drain impurity-diffused layers and over the gate electrodes, in order to lower the contact resistance. Titanium silicide, cobalt silicide, nickel silicide and so forth are adoptable to the silicide layers. In particular in recent years, Pt-doped nickel silicide has been used in view of improving the heat resistance.

Japanese Laid-Open Patent Publication No. 2007-067225 may be exemplified as a publicly-known literature disclosing a method of manufacturing a semiconductor device. Japanese Laid-Open Patent Publication No. 2007-067225 discloses a technique of forming Er-doped nickel silicide.

As described in the above, the conventional semiconductor devices have been suffering from increase in the junction leakage and resistivity, as a result of thinning of the silicide layers.

SUMMARY

According to the present invention, there is provided a semiconductor device which includes:

a semiconductor substrate;

a transistor provided over the semiconductor substrate; and silicide layers provided over impurity-diffused layers of the transistor;

wherein the silicide layers contain a silicidation-suppressive metal, the concentration of the silicidation-suppressive metal in each silicide layer, over a region thereof ranging from the surface to a predetermined depth, increases from the surface of each silicide layer in the depth-wise direction of the semiconductor substrate, and the surface of each silicide layer is positioned above the surface of the semiconductor substrate.

According to the present invention, there is provided also a method of manufacturing a semiconductor device which includes:

forming source-and-drain, impurity-diffused layers in surficial portions of a semiconductor substrate;

forming a first metal film suppressing silicidation reaction over the source-and-drain, impurity-diffused layers;

forming a second metal film over the first metal film;

forming primary silicide layers by annealing the semiconductor substrate;

removing unreacted portions of the first and second metal films from the semiconductor substrate; and growing a secondary silicide layer over the primary silicide layer.

The present invention can now provide a semiconductor device and a method of manufacturing the same, capable of suppressing spike of silicide layers formed over the source/drain impurity-diffused layers, or penetration of the contacts, and are thereby reduced in the junction leakage and lowered in the resistivity of the silicide layers.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1 is a sectional view illustrating a semiconductor device according to a first embodiment of the present invention;

FIGS. 4A and 4B are sectional views illustrating steps of manufacturing a semiconductor device of a second embodiment;

FIGS. 6A to 8C are sectional views illustrating steps of manufacturing a semiconductor device of a fourth embodiment.

DETAILED DESCRIPTION

Before describing of the present invention, the related art of manufacturing a semiconductor device using a Pt-doped nickel silicide layer as the silicide layer will be explained in detail with reference FIGS. 9A to 10C in order to facilitate the understanding of the present invention.

Device isolation regions 62 (Shallow Trench Isolation; STI) are formed in the surficial portions of a semiconductor substrate 60 by a publicly-known method. Next, in the device forming region, a gate insulating film (not illustrated) composed of a thermal oxide film, and polysilicon electrodes 66 are formed. Thereafter, low-concentration doped regions 64 (LDD regions) are formed by ion implantation of an n-type impurity, for example.

Figure 9A:
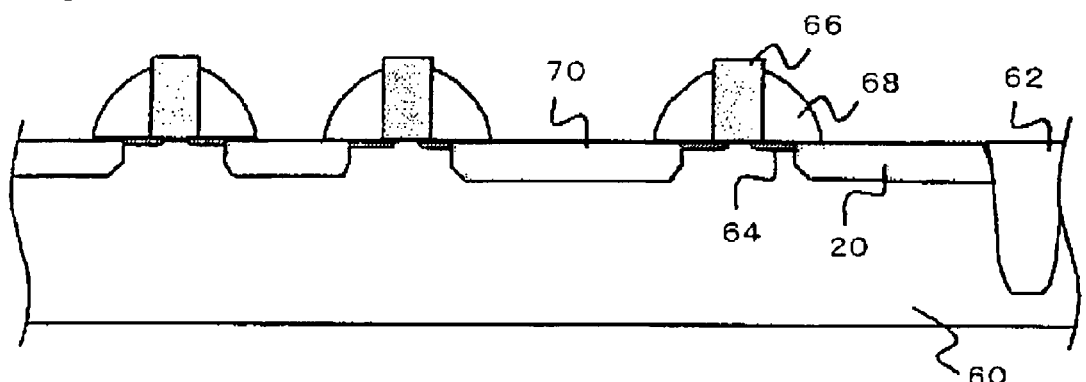
FIGS. 9A to 10C are sectional views illustrating steps of manufacturing a conventional semiconductor device.

Next, an oxide film is formed over the entire surface, and then anisotropically etched back to form sidewalls 68 on the side faces of the polysilicon electrodes 66. Next, an n-type impurity ion is implanted, to thereby form source/drain impurity-diffused layers 70 as high-concentration doped regions (FIG. 9A).

Figure 9B:
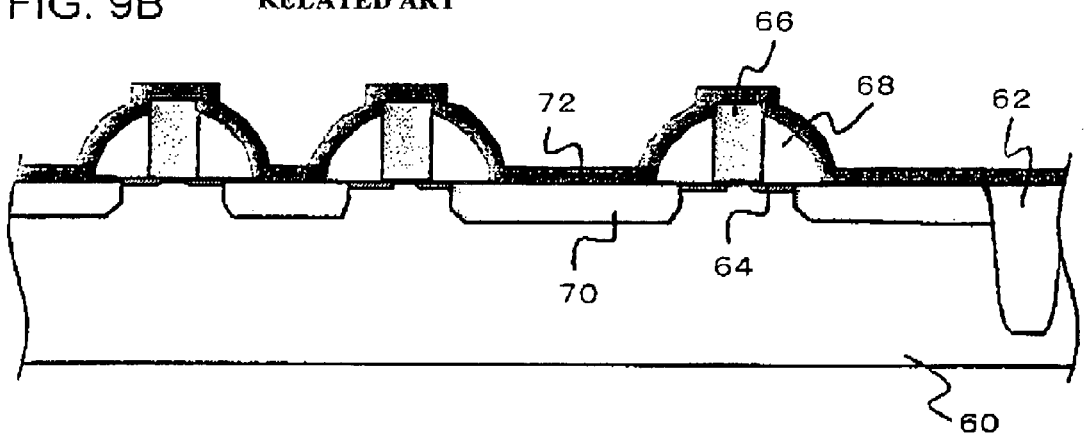

Next, a NiPt alloy film 72 of 8 nm thick or around is formed by sputtering over the entire surface (FIG. 9B). Pt content of the NiPt alloy film 72 is approximately 5% in general.

Figure 9C:
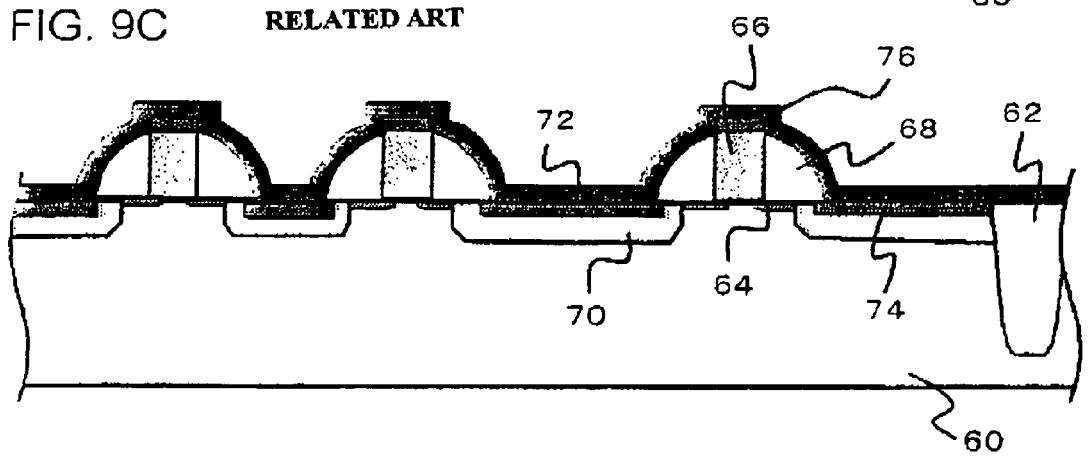

Next, the product is annealed at 375° C. to thereby form primary silicide layers 74, 76 (FIG. 9C). The silicide layers formed in this process are composed of Pt-doped $Ni_2Si$.

Figure 10A:
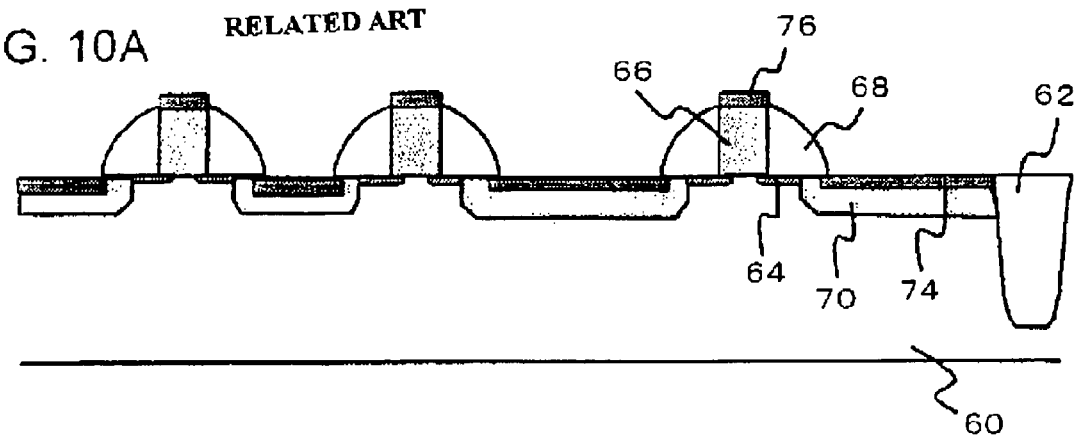

Unreacted portions of the NiPt alloy film are then removed by wet etching using aqua regia (FIG. 10A). In this way, the silicide layers 74, 76 doped with approximately 5% of Pt are formed in the surficial portions of the source/drain impurity-diffused layers 70 and the polysilicon electrodes 66.

Figure 10B:
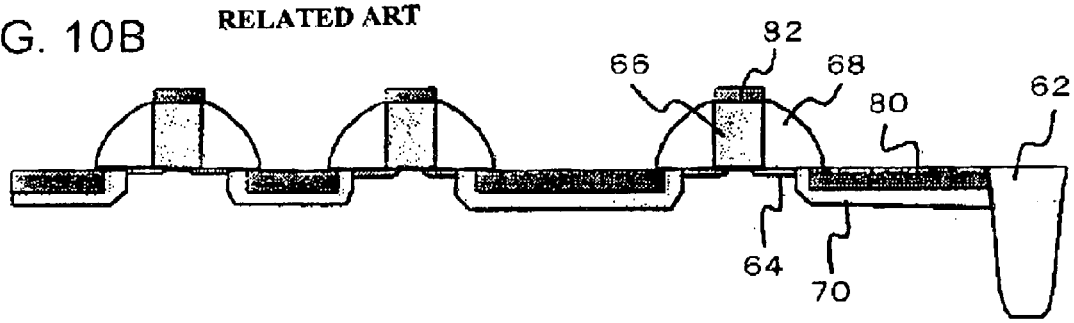

Annealing thereafter at a temperature of as high as 500° C. turns the silicide into Pt-doped NiSi. In this way, silicide layers 82 over the polysilicon electrodes 66, composed of Pt-doped NiSi, and silicide layers 80 over the source/drain impurity-diffused layers 70, composed of Pt-doped NiSi, are formed (FIG. 10B).

Figure 10C:
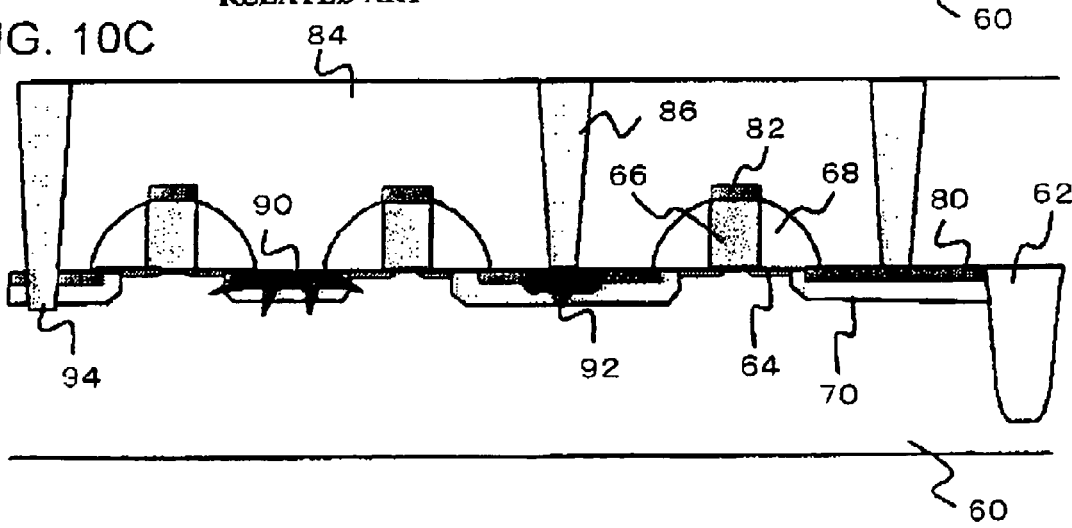

An insulating interlayer 84 is then formed over the entire surface by a publicly-known method, and contact holes are formed therein by dry etching. The contact holes are filled with a metal film typically composed of W or the like, and the metal film is then planarized by CMP to thereby form contact plugs 86 (FIG. 10C). The conventional semiconductor device is thus obtained. Multi-layer interconnect, generally formed on the upper layer of the semiconductor device, is not illustrated in this example.

In the silicide layers 80 in the semiconductor device manufactured by the above-described method, the doped Pt uniformly distributes over the entire film.

The surface of the silicide layers 80 is positioned substantially at the same level as the surface of the semiconductor substrate 60.

With advancement of recent dimensional shrinkage in semiconductor elements, the depth of pn junction of the source/drain impurity-diffused layers 70 of the MOS transistors have been becoming shallower. Accordingly, also the silicide layers formed over the surface of the source/drain impurity-diffused layers 70 have been becoming thinner. The situation has, however, raised various problems as described below (FIG. 10C).

Such thinning of the silicide layers may be successful in reducing the junction leakage for the case where the transistor has a relatively wide space between the adjacent gate electrodes, but may adversely generate spikes 90 as illustrated in FIG. 10C for the case where the gate-to-gate distance is relatively narrow, and may consequently increase the junction leakage.

In the step of dry etching for forming the contact holes, the surface of the silicide layers are exposed to and thereby heated with, a plasma. Also for this reason, the spikes 92 of silicide may generate in the region under the contact portions with the source/drain impurity-diffused layers 70 as illustrated in FIG. 10C, and again the junction leakage may undesirably increase.

In the process of forming the contact holes, the silicide layers expectedly serve as an etching stopper of the dry etching.

However, a tendency towards further thinning of the silicide layers allows the etching to proceed across the pn junction of the source/drain impurity-diffused layer 70, so as to make the contact plugs 94 reach the semiconductor substrate as illustrated in FIG. 10C. Also for this reason, the junction leakage may increase.

The thinning of the silicide layer may still also result in increase in the resistivity of the silicide layers.

The invention will now be described herein with reference to an illustrative embodiment. Those skilled in the art will recognize that many alternative embodiments can be accomplished using the teachings of the present invention and that the invention is not limited to the embodiment illustrated for explanatory purposes.

Preferred embodiments of the present invention will be detailed below, referring to the attached drawings. Note that any similar constituents will be given with similar reference numerals in all drawings, and explanations therefor will not be repeated.

First Embodiment

FIG. 1 is a sectional view illustrating a semiconductor device 1 of the first embodiment. The semiconductor device 1 has transistors formed on a semiconductor substrate 10. The gate electrode of each transistor is composed of a polysilicon electrode 14 and a silicide layer 32 formed thereon. The semiconductor device 1 further has low-concentration doped regions 16, source/drain impurity-diffused layers 20 composed of high-concentration doped regions, and silicide layers 30 formed over the source/drain impurity-diffused layers 20. The surface of each silicide layer 30 is positioned above the surface of the semiconductor substrate 10. The silicide layers 30 contain a silicidation-suppressive metal, and have a concentration profile according to which the concentration of the silicidation-suppressive metal increases from the surface of each silicide layer 30 in the depth-wise direction of the substrate, over a region of each silicide layer 30 ranging from the surface thereof to a predetermined depth.

The concentration profile of the silicidation-suppressive metal is such that:

(i) the concentration decreases upwardly from a reference plane, which is defined at the level of the surface of substrate; and (ii) the concentration decreases downwardly in the depth-wise direction of the substrate from the reference plane.

FIGS. 2A to 3C are sectional views illustrating steps of manufacturing the semiconductor device of this embodiment.

Device isolation regions 12 (Shallow Trench Isolation; STI) are formed in the surficial portion of the semiconductor substrate 10 by a publicly-known method. A silicon substrate may typically be adoptable as the semiconductor substrate 10. Next, in the device forming region, a gate insulating film (not illustrated) composed of a thermal oxide film, and polysilicon electrodes 14 are formed.

Thereafter, $BF_2$ is implanted at an acceleration voltage of 35 keV, a dose of $4\times10^{13}$ atoms/cm$^2$, and an angle of implantation of 30°, then As is implanted at an acceleration voltage of 2 keV, a dose of $8\times10^{14}$ atoms/cm$^2$, and an angle of implantation of 0°.

In this way, the low-concentration doped regions 16 are formed. Next, an oxide film is formed over the entire surface, and the oxide film is then anisotropically etched to form sidewalls 18 on the side faces of the polysilicon electrodes 14.

Figure 2A:
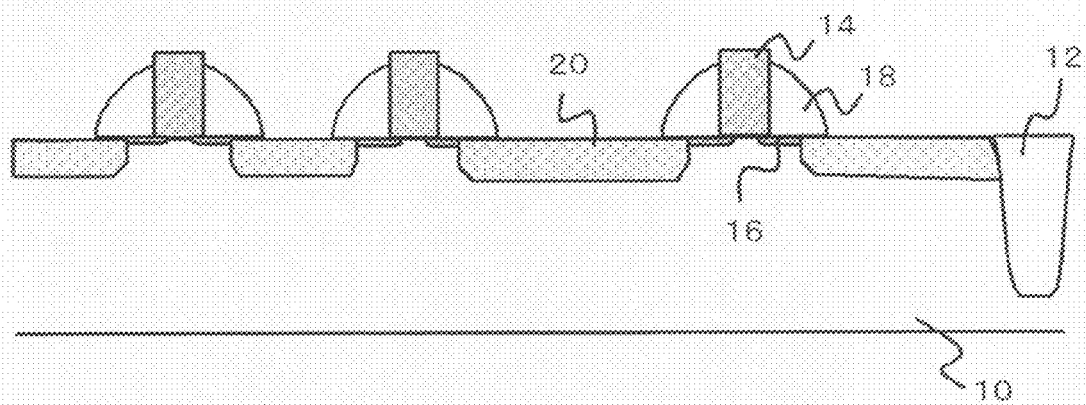
FIGS. 2A to 3C are sectional views illustrating steps of manufacturing the semiconductor device of the first embodiment.

Next, As is implanted at an acceleration voltage of 5 keV, a dose of $2\times10^{15}$ atoms/cm$^2$, and an angle of implantation of 0°, and P is then implanted at an acceleration voltage of 20 keV, a dose of $5\times10^{13}$ atoms/cm$^2$, and an angle of implantation of 0°. In this way, the source/drain impurity-diffused layers 20 are formed as the high-concentration doped regions (FIG. 2A).

Next, a first metal film 22 containing a silicidation-suppressive metal is formed. The silicidation-suppressive metal may be at least one species of metal selected from the group consisting of Pt, Ir, Tb, Dy, Ho, Er, Tm and Yb.

Figure 2B:
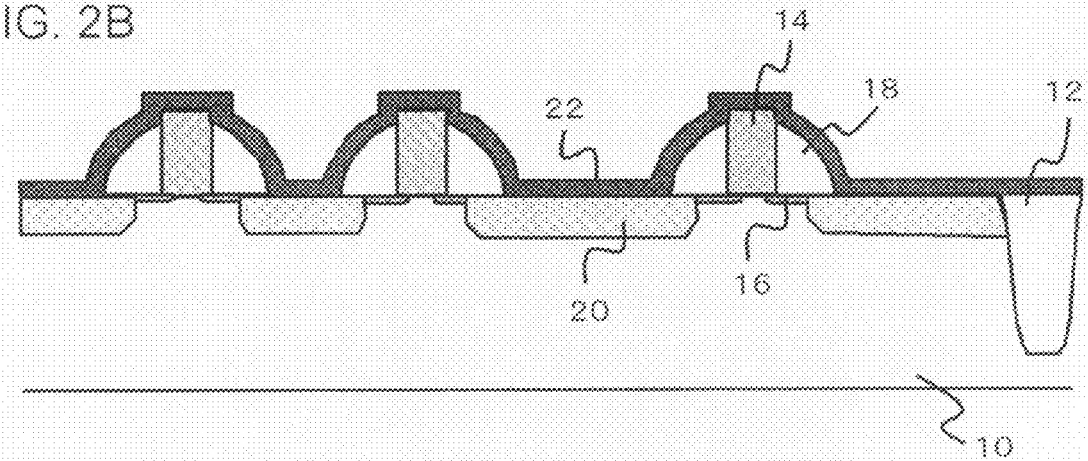

In this embodiment, Pt was used as the silicidation-suppressive metal. The film was formed typically by sputtering, at a temperature of 23° C., to as thick as 1 nm (FIG. 2B).

Figure 2C:
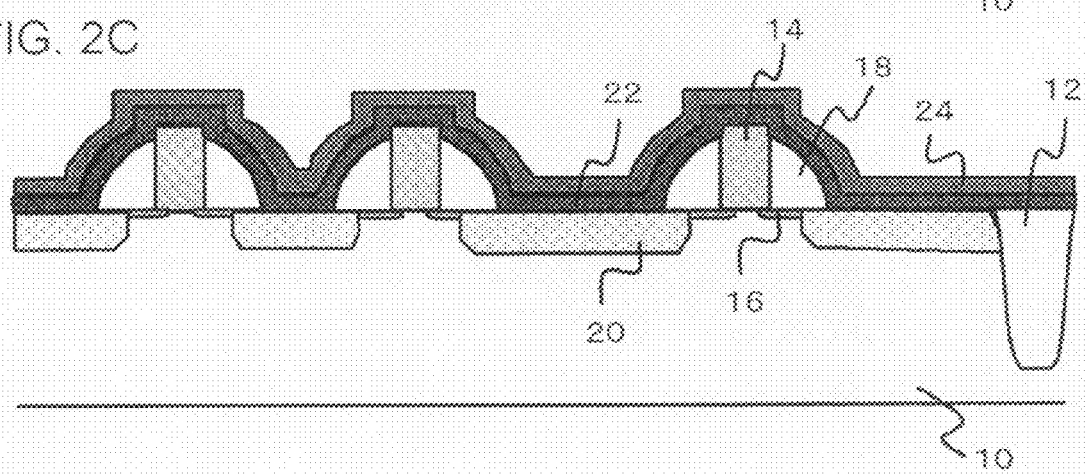

Next, a second metal film 24 is formed over the entire surface. In this embodiment, a Ni film was used as the second metal film 24. The film was formed typically by sputtering, at a temperature of 23° C., to as thick as 7 nm (FIG. 2C).

Figure 3A:
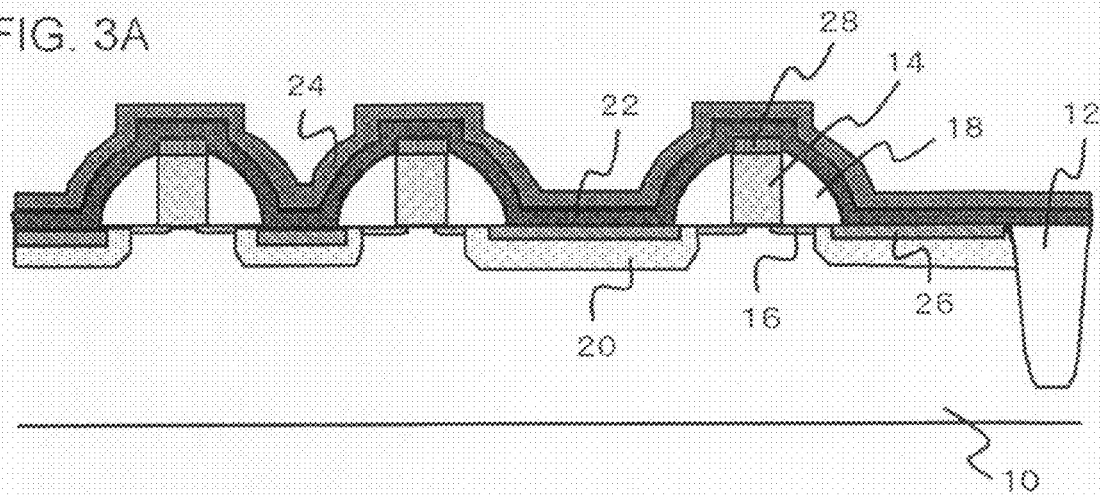

Next, the product is annealed for 90 seconds, so as to proceed a silicidation reaction (FIG. 3A).

Figure 3B:
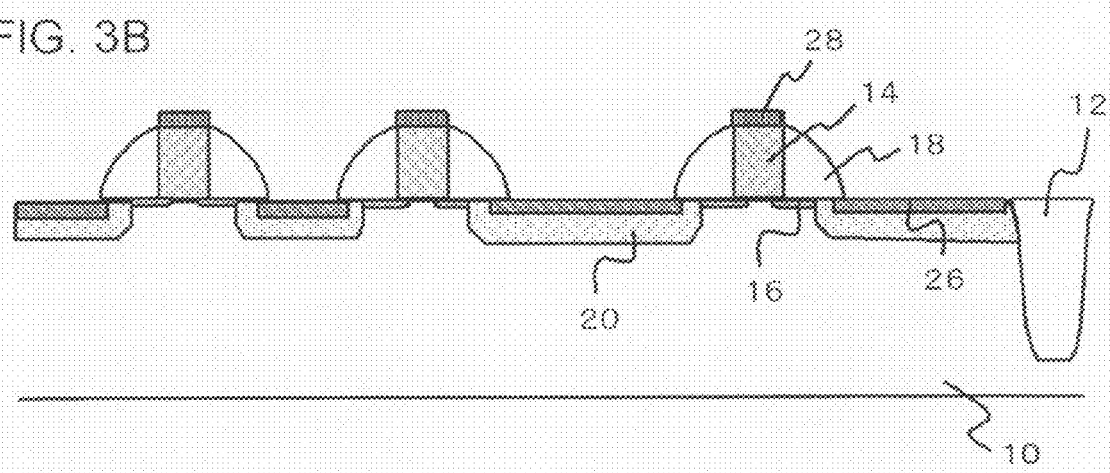

Next, unreacted portions of Ni and Pt are removed by wet etching using aqua regia (FIG. 3B). In this way, primary silicide layers 26, 28 are formed in the surficial portions of the source/drain impurity-diffused layers 20 and in the surficial portions of the polysilicon electrodes 14.

The primary silicide layers 26, 28 formed in this step are made of Pt-doped $Ni_2Si$, and has a Pt concentration profile according to which the concentration of Pt, as the silicidation-suppressive metal, reduces from the surface of each primary silicide layer in the depth-wise direction of the substrate.

Figure 3C:
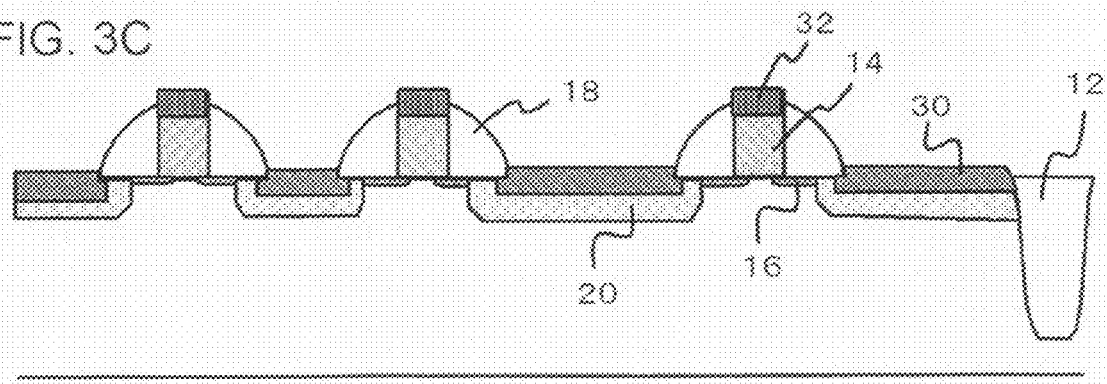

Next, a silicon-containing gas is supplied while heating the product, so as to allow the primary silicide layers 26, 28 to react with the silicon-containing gas, to thereby grow secondary silicide layers over the surface of the primary silicide layers 26, 28 (FIG. 3C).

The silicon-containing gas may typically be monosilane, disilane, trisilane, dichlorosilane, HDMS (hexamethyldisilazane) and so forth. Monosilane was used in this example. Monosilane was introduced at 400° C., a flow rate of 10 sccm, for 10 minutes.

According to the method of manufacturing in this embodiment, the surface of each secondary silicide layer is positioned above the surface of the semiconductor substrate (represented by the level of the surface of STI, in FIG. 3C). The entire portion of the silicide layers 30, 32, which are composed of the primary silicide layers 26, 28 and the secondary silicide layers, has a Pt concentration profile according to which the concentration of Pt, as the silicidation-suppressive metal, increases from the surface of the silicide layers 30, 32 in the depth-wise direction of the substrate.

According to the method of manufacturing of this embodiment, the source/drain impurity-diffused layers 20 are formed, and the first metal film 22, which is composed of a silicidation-suppressive metal, is formed on the upper side thereof.

When the silicidation reaction is allowed to proceed by annealing, Pt as a silicidation-suppressive metal may diffuse from the first metal film 22 towards the source/drain impurity-diffused layers 20.

Accordingly, the concentration of silicidation-suppressive metal reduces downwardly in the depth-wise direction of the substrate from the reference plane which is defined at the level of the surface of substrate.

Thereafter, unreacted portions of Ni and Pt are removed, a silicon-containing gas is then supplied while heating the product, so as to allow the primary silicide layer to react with the silicon-containing gas, to thereby grow the secondary silicide layers over the surface of the primary silicide layers 26.

In this process, the silicidation-suppressive metal which resides in the vicinity of the reference plane, which is defined at the level of the surface of substrate, diffuses into the growing secondary silicide layers, and diffuses also downwardly in the depth-wise direction of the substrate from the reference plane into the primary silicide layer.

As a consequence, the concentration of silicidation-suppressive metal becomes maximum in the vicinity of the reference plane, which is defined at the level of the surface of substrate, reduces towards the surface of the silicide layers, and similarly reduces also downwardly in the depth-wise direction of the substrate.

An insulating interlayer 34 is then formed over the entire surface by a publicly-known method, and the contact holes are formed therein by dry etching.

Thereafter, the contact holes are filled with a metal film typically composed of W or the like, and the metal film is then planarized by CMP to thereby form contact plugs 36 (FIG. 1). The semiconductor device of this embodiment is thus obtained. Multi-layer interconnect, generally formed on the upper layer of the semiconductor device, is not illustrated in this example.

Effect of this embodiment will be explained below.

Since the semiconductor device of this embodiment contains Pt as the silicidation-suppressive metal in the silicide layer, and the concentration profile of which is such that (i) the concentration decreases upwardly from the reference plane, which is defined at the level of the surface of substrate; and (ii) the concentration decreases downwardly in the depth-wise direction of the substrate from the reference plane, so that the silicidation reaction is to be suppressed from proceeding in the depth-wise direction of the substrate, and so that the silicide spike may be suppressed.

The Pt concentration at the interface between the silicide layer 30 and the source/drain impurity-diffused layers may be adjusted 1.05 to 100 times, preferably 1.05 to 10 times as high as the Pt concentration in the surficial portion of the silicide layer 30. In this way, the silicide spike into the depth-wise direction of the substrate may be suppressed by virtue of Pt as the silicidation-suppressive metal.

As a consequence, the silicide spike such as penetrating the pn junction of the source/drain impurity-diffused layers 20 may be avoidable, even for the case where the gate-to-gate distance is small, and for the case where the surface of the silicide layers are exposed to, and thereby heated with, a plasma in the process of dry etching for forming the contact holes. The junction leakage may consequently be reduced.

In the semiconductor device of this embodiment, the surface of each silicide layers is positioned above the surface of the semiconductor substrate. Each silicide layer may therefore ensure a sufficient thickness, even if the source/drain impurity-diffused layers 20 are thin. The silicide layer may function also as an etching stopper in the process of dry etching for forming the contact holes. The junction leakage may consequently be reduced.

The configuration of this embodiment capable of ensuring a sufficient thickness of the silicide layers also takes an effect of lowering the resistivity of the silicide layers.

In contrast, Japanese Laid-Open Patent Publication No. 2005-142422 describes formation of a cobalt silicide layer, after the source/drain, impurity-diffused layers are implanted with a silicidation-suppressive impurity ion, or covered with an insulating film for suppressing silicidation.

Japanese Laid-Open Patent Publication No. 2005-142422 might be successful in suppressing the silicide spike, but may increase the resistivity of the silicide layers because of their reduced thickness. In addition, since the silicide layer is insufficient in the thickness as an etching stopper in the process of etching for forming the contact holes, there may be a fear of causing penetration by the contact plugs.

Second Embodiment

A method of manufacturing a semiconductor device according to a second embodiment is same as that in the first embodiment, up to the step of forming the primary silicide layers 26, 28, and the step of removing the unreacted portions of Ni and Pt (FIG. 2A).

This embodiment differs from the first embodiment, only in that, after the unreacted portions of Ni and Pt are removed, a secondary silicide layer is formed by sputtering as illustrated in FIG. 4A.

More specifically, the unreacted portions of Ni and Pt are removed, and a silicon film 40 is formed over the entire surface by sputtering at room temperature (FIG. 4A). In this process, the silicon film 40 is formed also over the sidewalls 18 and STI 12.

Next, the product is annealed at 500° C. for 30 seconds, so as to allow Ni and Pt to diffuse from the primary silicide layers 26, 28 to the silicon film 40, to thereby form the secondary silicide layers. The unreacted portions of the silicon film are then removed by washing using an ammonia-hydrogen peroxide mixed solution (APM) (FIG. 4B).

The entire portion of the silicide layers 30, 32, which are composed of the primary silicide layers and the secondary silicide layers, have a Pt concentration profile according to which the concentration of Pt, as the silicidation-suppressive metal, increases from the surface of the silicide layers 30, 32 in the depth-wise direction of the substrate.

The insulating interlayer and the contact plugs are formed similarly to as described in the first embodiment.

Effects similar to those in the first embodiment may be obtained also by the semiconductor device of the second embodiment.

In this embodiment, the silicon film 40 is formed by sputtering also on the surface of the sidewalls 18 as illustrated in FIG. 4A.

Accordingly, in the process of annealing thereafter, it is anticipated that also the silicon film 40 over the surface of the sidewalls 18 may be silicided in the process of annealing, because of Ni and Pt possibly supplied by diffusion from the primary silicide layer 28 over the polysilicon electrode 14, or from the primary silicide layer over the source/drain impurity-diffused layers 20.

If the silicide layers are formed over the surface of the sidewalls, the gates and the source/drain impurity-diffused layer 20 may concernedly be short-circuited by the low-resistivity primary silicide layers 26. However, since the silicon film formed over the sidewalls 18 by sputtering is intrinsically exempt from carbon contamination caused by dry etching, and has an amorphous structure, the silicon film may be suppressed from being non-uniformly silicided.

As a consequence, the silicidation reaction may uniformly proceed in the silicon film 40 formed over the surface of the sidewalls 18, so that the process may be controlled so as to avoid electrical short-circuiting between the gates and the source/drain impurity-diffused layers 20.

Third Embodiment

A semiconductor device of a third embodiment is same as that in the second embodiment, in that the secondary silicide layer is formed by sputtering.

Figure 5A:
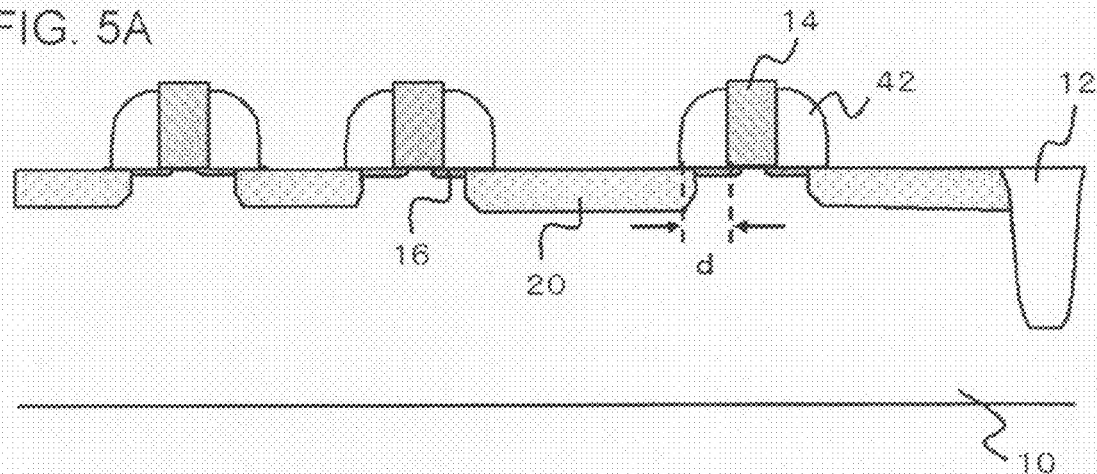
FIGS. 5A to 5C are sectional views illustrating steps of manufacturing a semiconductor device of a third embodiment.
Figure 5B:
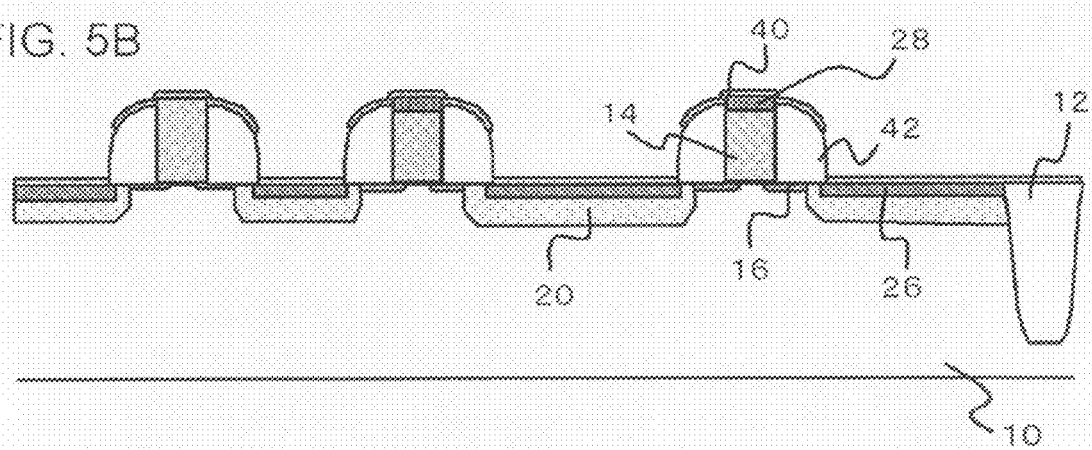
Figure 5C:
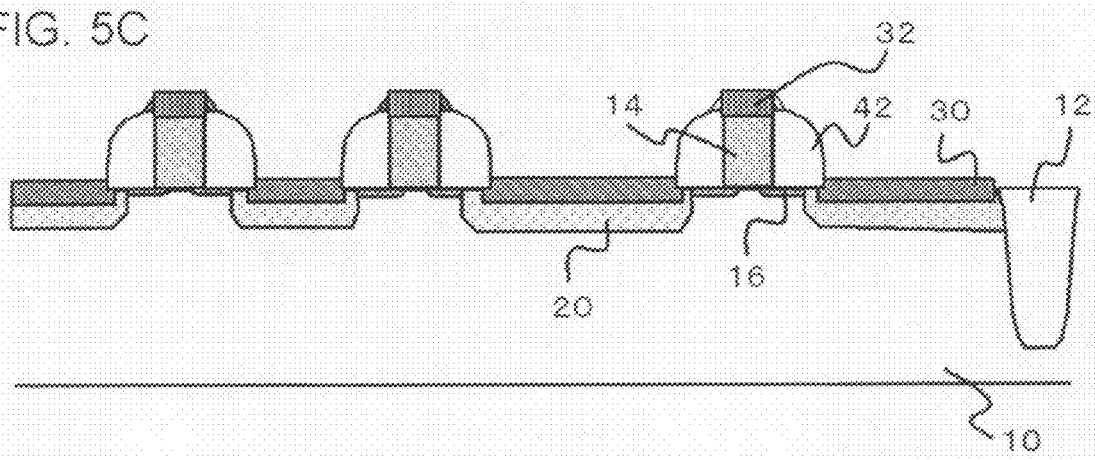

The third embodiment is, however, different from the second embodiment, in that the sidewalls are made to have nearly vertical shape as illustrated in FIGS. 5A to 5C, so as to avoid deposition of the silicon film over the surface of the sidewalls.

A method of manufacturing according to this embodiment will be explained referring to FIGS. 5A to 5C.

The source/drain impurity-diffused layers 20 are formed as the high-concentration doped regions, similarly to as described in the first embodiment. Note that the sidewalls 42 are formed to a nearly vertical shape. According to the recent tendency towards further dimensional shrinkage of semiconductor devices, the width d of the sidewalls 42 (see FIG. 5A) is 25 to 30 nm in the 45-nm generation, and 20 nm or narrower in the 32-nm generation.

More specifically, the sidewalls 42 are formed to have a nearly vertical shape. If the silicon film 40 is formed by sputtering over the substrate having thus-shaped sidewalls 42, the nearly vertical side faces of the sidewalls 42 have no silicon deposited thereon, as illustrated in FIG. 5B.

A series of steps after the silicon film is formed by sputtering, including annealing for forming the secondary silicide layer (FIG. 5B), and removal of the unreacted portions of the silicon film by washing using APM (FIG. 5C), are same as those in the second embodiment.

As has been descried in the above, the semiconductor device of this embodiment successfully avoids electrical short-circuiting between the gate electrodes and the source/drain impurity-diffused layers 20 through the silicide layers. In other words, the electrical short-circuiting between the gate electrodes and the source/drain impurity-diffused layers 20 through the silicide layers may reliably be prevented.

Effects similar to those in the first embodiment may be obtained also by the semiconductor device of the first embodiment.

Fourth Embodiment

A semiconductor device of a fourth embodiment is same as that in the second embodiment, in that the secondary silicide layer is formed by sputtering. In the semiconductor device of this embodiment, as illustrated in FIG. 6C, each sidewall is composed of a $SiO_2$ film (first insulating film 50) covering the side face of each polysilicon electrode and a part of the surface of each source/drain impurity-diffused layer 20, and a SiN film (second insulating film 52) covering the surface of the $SiO_2$ film.

In addition, as illustrated in broken line circles a1, a2 in FIG. 6C, the edges of the $SiO_2$ film (first insulating film 50) have a notched geometry recessed from the edges of the SiN film (second insulating film 52).

A method of manufacturing of this embodiment will be explained below, referring to FIG. 6A to FIG. 8C.

The processes up to the formation of the device isolation regions, the gate insulating film (not illustrated), the polysilicon electrodes, and the low-concentration doped region (LDD regions) in or over the substrate may be carried out similarly to as described in the other embodiments. Next, the $SiO_2$ film is formed to as thick as 10 nm by CVD (420° C.), and the SiN film is then formed to as thick as 10 nm by ALCVD (400° C.).

The $SiO_2$ and SiN films are then processed by dry etching, to produce the sidewalls composed of two these films (FIG. 6A).

Next, similarly to as described in the first embodiment, the source/drain impurity-diffused layers 20 are formed as the high-concentration doped regions (FIG. 6B). The product is then treated using a dilute hydrofluoric acid solution (FIG. 6C).

Since the etchrate of the $SiO_2$ film using the dilute hydrofluoric acid solution is larger than the etchrate of the SiN film in this process, so that the notched geometry as illustrated in the broken line circles in FIG. 6C may be obtained.

Next, similarly to as described in the first embodiment, a film of Pt, which is a silicidation-suppressive metal, is formed by sputtering as the first metal film 22 (FIG. 7A), and a Ni film is then formed by sputtering as the second metal film 24 (FIG. 7B).

Next, similarly to as described in the first embodiment, silicidation reaction was proceeded by annealing (FIG. 7C), and the unreacted portions of Ni and Pt are removed by wet etching (FIG. 8A), to thereby form the primary silicide layers 26, 28 on the surface of the source/drain impurity-diffused layers 20 and on the surface of the polysilicon electrodes 14.

The primary silicide layers 26, 28 formed in this process are composed of Pt-doped $Ni_2Si$, and show a concentration profile according to which Pt as the silicidation-suppressive metal decreases from the surface of the primary silicide layers 26, 28 in the depth-wise direction of the substrate.

Figure 8A:
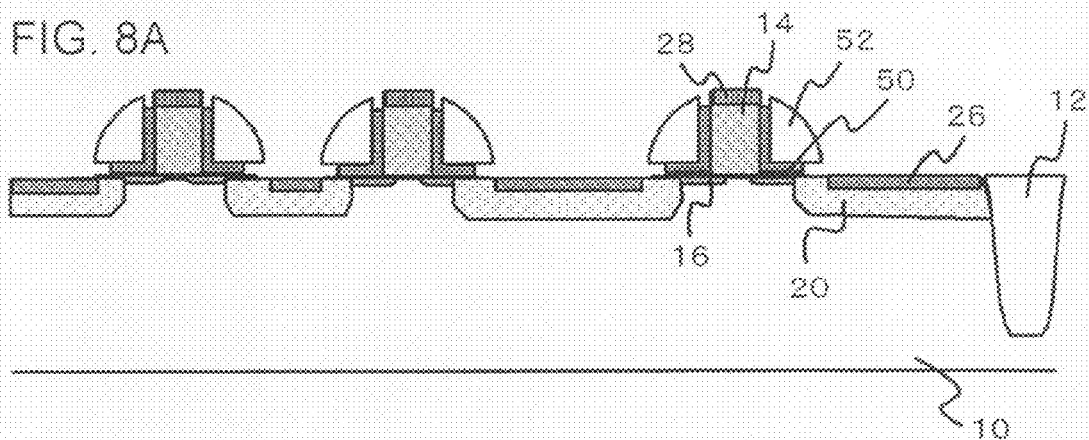
Figure 8B:
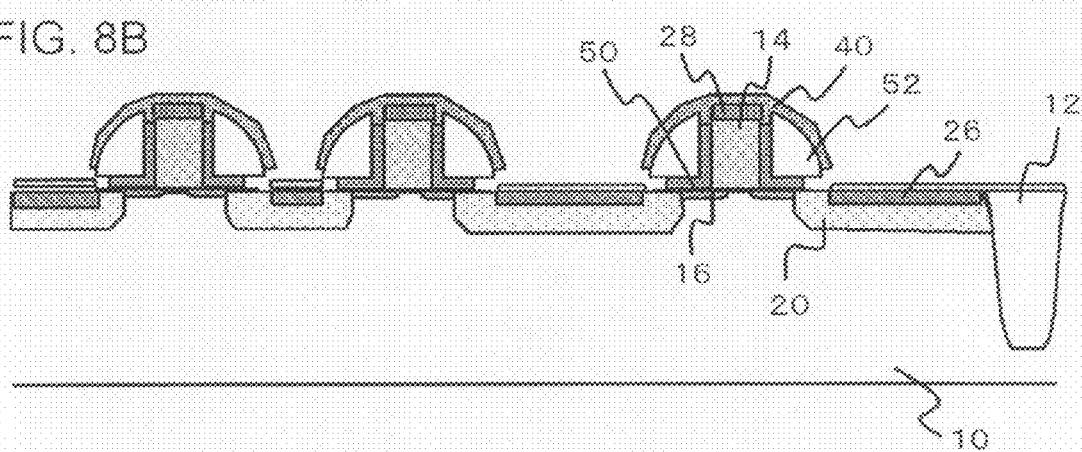

Next, the silicon film 40 is formed over the entire surface by sputtering at room temperature (FIG. 8B). In this process, the silicon film 40 is formed also over the sidewalls and the STI. Over a notch in the region surrounded by the broken line circle b1, the silicon film formed over the gate electrode and over the sidewall may be a continuum.

On the other hand, it is to be noted that, over a notch in the region surrounded by the broken line circle b2, the silicon film 40 formed over the sidewalls and the silicon film 40 formed over the source/drain impurity-diffused layers 20 are discontinuous, due to the notched geometry.

By virtue of this configuration, the gate electrodes and the source/drain impurity-diffused layers 20 are reliably prevented from being electrically short-circuited even after the silicidation proceeded by annealing.

Figure 8C:
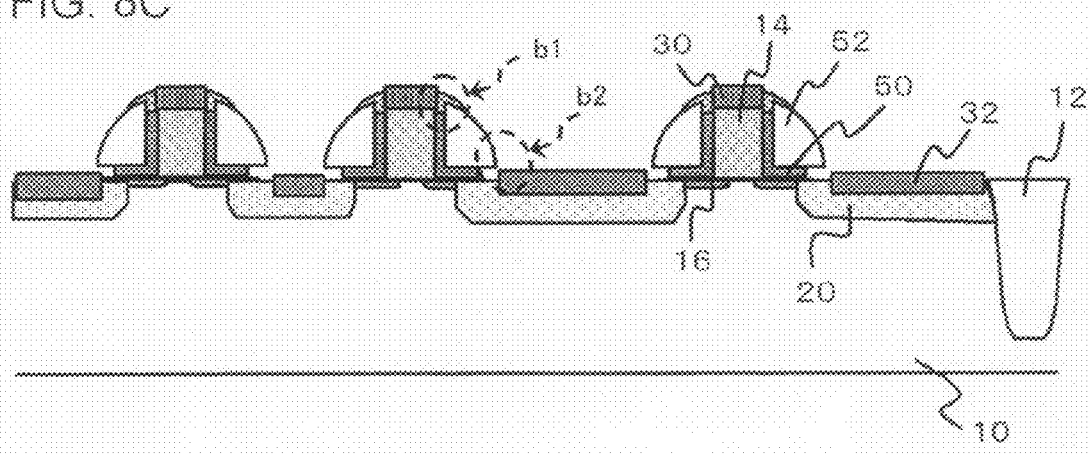

Next, the product is annealed at 500° C. for 90 seconds, so as to allow Ni and Pt to diffuse from the primary silicide layers 26, 28 to the silicon film 40, to thereby form the secondary silicide layers. The unreacted portions of the silicon film is then removed by washing using an ammonia-hydrogen peroxide mixed solution (APM) (FIG. 8C).

The entire portion of the silicide layers 30, 32, which are composed of the primary silicide layers and the secondary silicide layers, have a Pt concentration profile according to which the concentration of Pt, as the silicidation-suppressive metal, increases from the surface of the silicide layers 30, 32 in the depth-wise direction of the substrate. The insulating interlayer and the contact plugs are formed similarly to as described in the first embodiment.

Effects similar to those in the first embodiment may be obtained also by the semiconductor device of this embodiment.

The semiconductor device of the present invention is not limited to those shown in the above-described embodiments, instead allows various modifications. For example, the configuration of the present invention may take similar effects when adopted to P-MOS transistors, although N-MOS transistors were exemplified in the above-described embodiments.

In addition, the unreacted portions of the silicon film remained on the STI and on the sidewalls may be oxidized, although they were removed by washing using APM in the second, third and fourth embodiments.

It is apparent that the present invention is not limited to the above embodiments, that may be modified and changed without departing from the scope and spirit of the invention.

What is claimed is:

1. A semiconductor device, comprising:
    a semiconductor substrate;
    a transistor provided over said semiconductor substrate; and
    a silicide layer provided over impurity-diffused layers of said transistor,
    wherein said silicide layer comprises a silicidation-suppressive metal, and
    wherein a concentration of said silicidation-suppressive metal in said silicide layer, over a region thereof ranging from a surface of said semiconductor substrate to a predetermined distance, decreases upwardly from a reference plane defined at a level of the surface of said semiconductor substrate, and decreases downwardly in a depth-wise direction of said semiconductor substrate from the reference plane.

2. The semiconductor device as claimed in claim 1, wherein said silicidation-suppressive metal is at least one species of metal selected from the group consisting of platinum (Pt), iridium (Ir), terbium (Tb), dysprosium (Dy), holmium (Ho), erbium (Er), thulium (Tm), and ytterbium (Yb).

3. The semiconductor device as claimed in claim 1, wherein said silicide layer comprises a nickel silicide.

4. The semiconductor device as claimed in claim 3, wherein said silicidation-suppressive metal comprises Pt.

5. The semiconductor device as claimed in claim 1, further comprising:
    sidewalls provided on side faces of a gate electrode of said transistor, each of said sidewalls comprising a first insulating film covering a side face of said gate electrode, and a part of a surface of a source-and-drain region of said transistor, impurity-diffused layer, and a second insulating film covering said first insulating film,
    wherein edges of said first insulating film have a notched geometry recessed from edges of said second insulating film.

6. The semiconductor device as claimed in claim 1, wherein said silicide layer comprises a single layer.

7. The semiconductor device as claimed in claim 1, further comprising:
    sidewalls provided on side faces of a gate electrode of said transistor,
    wherein a portion of a surface of said silicon layer, which is located outside the sidewalls, is positioned above the surface of said semiconductor substrate.

* * * * *